United States Patent
Chen et al.

(10) Patent No.: US 9,465,071 B2
(45) Date of Patent: Oct. 11, 2016

(54) METHOD AND APPARATUS FOR GENERATING FEATURED SCAN PATTERN

(71) Applicant: MEDIATEK INC., Hsin-Chu (TW)

(72) Inventors: Harry Hai Chen, Hsinchu (TW); Shih-Hua Kuo, Tainan (TW); Chih-Sheng Tung, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 38 days.

(21) Appl. No.: 14/637,311

(22) Filed: Mar. 3, 2015

(65) Prior Publication Data

US 2015/0253384 A1    Sep. 10, 2015

Related U.S. Application Data

(60) Provisional application No. 61/947,687, filed on Mar. 4, 2014, provisional application No. 61/952,924, filed on Mar. 14, 2014, provisional application No. 62/045,015, filed on Sep. 3, 2014.

(51) Int. Cl.
| | |
|---|---|
| *G01R 31/28* | (2006.01) |
| *G01R 31/3177* | (2006.01) |
| *G01R 31/3183* | (2006.01) |
| *G01R 31/3185* | (2006.01) |

(52) U.S. Cl.
CPC ... *G01R 31/3177* (2013.01); *G01R 31/318342* (2013.01); *G01R 31/318547* (2013.01)

(58) Field of Classification Search
CPC .............. G01R 31/3177; G01R 31/318342; G01R 31/318547
USPC ......................................................... 714/726
See application file for complete search history.

(56) References Cited

U.S. PATENT DOCUMENTS

| | | | | |
|---|---|---|---|---|
| 2007/0143718 | A1* | 6/2007 | Abercrombie | G06F 17/5009 716/52 |
| 2009/0132976 | A1* | 5/2009 | Desineni | G01R 31/318342 716/106 |
| 2010/0232242 | A1* | 9/2010 | Deng | G11C 29/023 365/201 |
| 2010/0318313 | A1* | 12/2010 | Agarwal | G01R 31/318511 702/117 |

* cited by examiner

*Primary Examiner* — David Ton
(74) *Attorney, Agent, or Firm* — Winston Hsu; Scott Margo

(57) ABSTRACT

An method of generating a featured scan pattern for scan test includes: providing a plurality of predetermined scan patterns to perform scan test on a plurality of devices under test (DUT) under a stress condition to generate a plurality of test responses of each DUT; grouping a plurality of specific test responses of each DUT from the test responses of each DUT to determine a feature value corresponding to a failure feature for each DUT; and generating at least one featured scan pattern according to the feature value of each DUT.

22 Claims, 6 Drawing Sheets

METHOD AND APPARATUS FOR GENERATING FEATURED SCAN PATTERN

CROSS REFERENCE TO RELATED APPLICATIONS

This application claims the benefit of U.S. provisional application No. 62/045,015 filed on Sep. 3, 2014, and also claims the benefit of U.S. provisional application No. 61/947,687 filed on Mar. 4, 2014, and also claims the benefit of U.S. provisional application No. 61/952,924 filed on Mar. 14, 2014. The entire contents of the related applications are incorporated herein by reference.

BACKGROUND

The present invention relates generally to scan test, and more particularly, to a method and apparatus for generating a featured scan pattern based on test responses of a plurality of devices under test that are scan tested under stress conditions.

Nanometer scaling with its attendant process variation has made it increasingly difficult to meet quality goals in complex system-on-chip (SoC) products. For multi-million gate digital circuitry in a SoC, scan pattern count continues to rise inexorably to achieve high fault coverage targeting defects that exhibit non-stuck-at behavior, such as delay faults. Recent developments to model defects at the transistor layout level inside digital standard cells, while offering the potential to catch more defects, come at the expense of greatly increased scan pattern count. Even with continued improvements in scan compression techniques, the unrelenting technological march toward higher gate count and larger pattern size in lock-step will nonetheless chisel away at profit margins. Scan design-for-testability (DFT) has now been universally adopted for digital circuitry in SoC's. It is a major contributor to the practice of testing that has allowed high product quality to be delivered within reasonable test cost.

However, chips passing production scan patterns with high structural fault coverage may sometimes end up failing functional operation in the end-user system. Product quality suffers as indicated by a rise in defective parts per million (DPPM). Incidences of no-trouble-found when chips are returned to the supplier for diagnosis reflect the difficulty of catching subtle defects. The time to reduce initial DPPM to meet customer requirements is lengthening, working against ever shortening product life-cycles. To understand why this is happening, consider the typical large die size of current SoC's. Across the die, operating conditions can show significant local variation in terms of power level and temperature due to electrical activity. Such operating profiles can also differ significantly between test mode and functional mode where certain signal paths, say between memory and logic, are blocked to satisfy DFT compliance. The functional operating condition where a subtle defect can trigger failure may never be encountered under normal test mode conditions running production scan patterns.

To minimize defect escapes missed by scan testing, system-level testing (SLT) that mimics the end-user application can be inserted as an extra and final test step. But SLT cannot guarantee complete functional coverage and it undesirably limits high-volume throughput. SLT can help in the early production stage to identify manufacturing test holes and ensure adequate initial product quality. But it should not be a permanent part of the production test flow; and effort should be made so its role reverts to that of occasional sample monitoring. Of course even with SLT, some defects can still end up as customer in-field failures, i.e., RMA (return merchandise authorization) parts.

In view of above, there is a need to improve the traditional test flow.

SUMMARY

With this in mind, it is one objective of the present invention to make predictions, upstream in the production test flow, either during wafer chip probe (CP) or package final test (FT), about downstream SLT/RMA failures such that reliance on SLT can be reduced, thus saving test cost, and faster time to low DPPM, i.e., better quality. To be cost effective, carrying out the prediction step should incur minimal overhead and preferably be done in-line.

The present invention achieves the above goal by scan test. In order to let scan patterns of the scan test be leveraged to make SLT/RMA failure predictions, the present invention performs scan test under non-destructive stress conditions instead of normal conditions. This is because all SLT/RMA fails are CP/FT escapes from production scan patterns. Subjecting a device to stress conditions can expose normally hidden defects. In stress condition, the device is operated at voltage and temperature extremes as well as runs faster than the specified datasheet maximum operating frequency Fmax, i.e., over-clocking.

For stress test conditions, scan output data at multiple below-nominal voltage and above-maximum frequency steps is collected. The stress conditions are aimed at reducing slack margins on all timing paths such that even small delay defects (SDD) have a chance to cause capture failures.

By running above Fmax, the present invention is in effect doing higher-than-at-speed testing (HTAST). But there is a key difference—the present invention does not use capture flop masking. In standard HTAST, path endpoint flops that do not meet timing are masked to prevent test overkill. Masking decisions are based on approximate and static corner-derived timing models which do not reflect dynamic activity in actual silicon and stress conditions. The scan test performed by the present invention focuses on capture failures, the more the better. So much so that scan patterns are applied in continue-on-fail mode to record all capture failures in all patterns. Devices/chips that pass provide little insight. Much more is revealed about a chip's true personality when stressed to the point of failure, and scan flops serve as internal probes to portray that personality in great detail.

Test responses of continue-on-fail scan test under the stress condition will be collected. As information of every scan flop is collected, observability is increased by orders of magnitude. After the scan test and data collection, the present invention conducts outlier analysis and machine learning to explore prediction models. In a sense, delay is the analog attribute of a digital circuit that is analyzed. We don't actually measure delays for that would be totally impractical. But capture failures can be viewed as crude samplings of delays, in every flop input cone, and in every pattern with diversely sensitized paths.

According to a first aspect of the present invention, a method of generating a featured scan pattern for scan test comprises: providing a plurality of predetermined scan patterns to perform scan test on a plurality of device under test (DUT) under stress condition to generate a plurality of test responses of each DUT; grouping a plurality of specific test responses of each DUT from the test responses of each DUT to determine feature value corresponding to a failure feature for each DUT; and generating at least one featured scan pattern according to the feature values of each DUT.

According to a first aspect of the present invention, an apparatus of generating a featured scan pattern for scan test, comprising: a test equipment, configured to perform scan test, according to a plurality of predetermined scan patterns, on a plurality of device under test (DUT) under stress conditions to generate a plurality of test responses of each DUT; a feature determination module, coupled to the test equipment, and configured to group a plurality of specific test responses from the test responses of each DUT to determine feature value corresponding to a failure feature for each DUT; and a featured scan pattern generation module, coupled to the feature determination module and configured to generate at least one featured scan pattern according to the feature values of each DUT.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Data Collection

Figure 1:
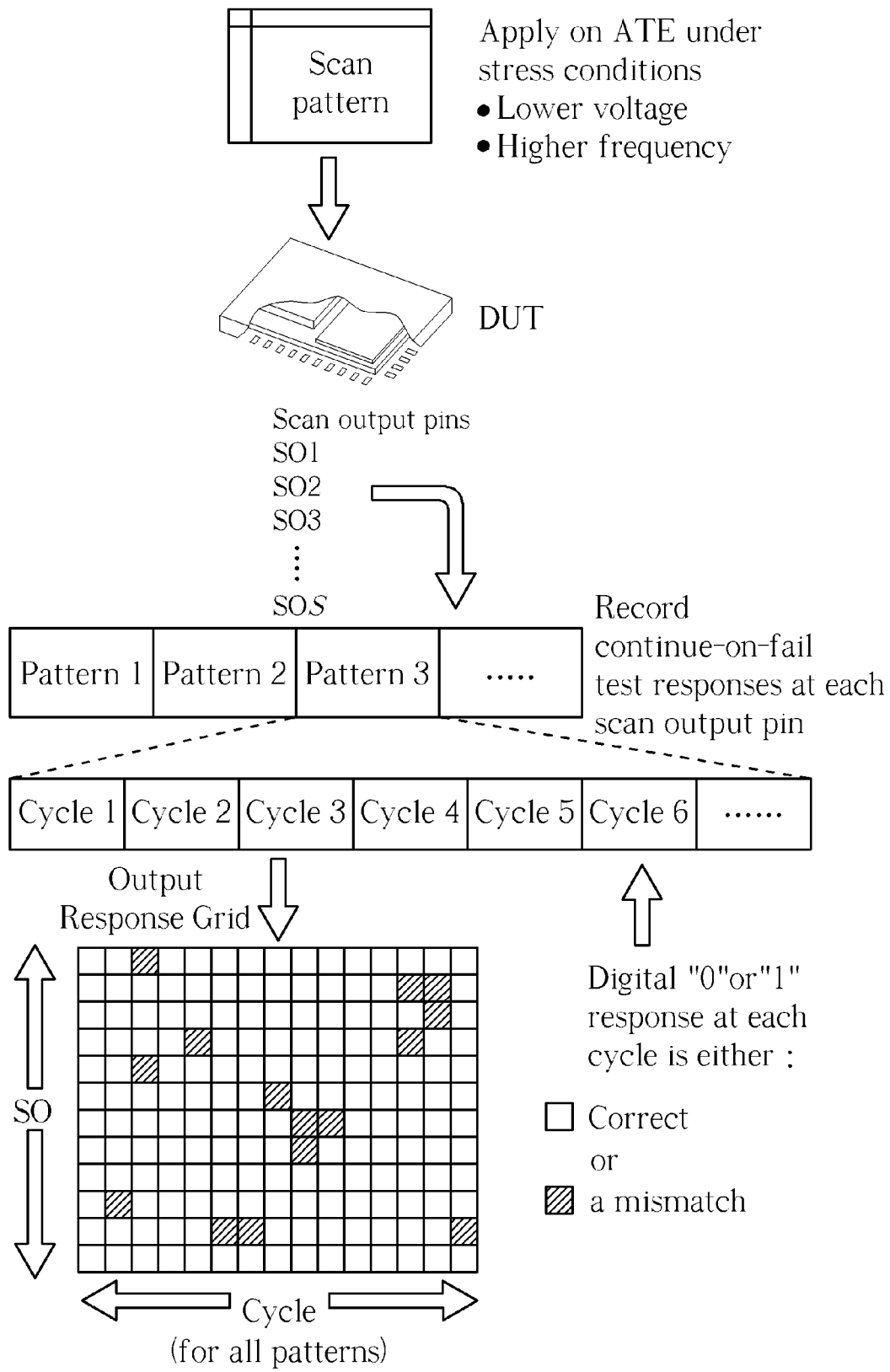
FIG. 1 illustrates a data collection flow of the present invention.

A data collection flow diagram of the present invention is illustrated in FIG. 1. In this embodiment, transition delay fault scan patterns using on-chip-clock (OCC) are applied to a device under test (DUT) on automated test equipment (ATE) under stress conditions. Transition delay fault scan patterns are used because it is assumed that most defects, regardless of actual physical mechanism, can manifest as delay faults. Note that the traditional stuck-at-faults are also included since they are simply special cases of slow-to-rise/fall faults with infinite delay. In addition, compressed OCC scan patterns are also available.

According to various embodiments, the stress conditions may refer to operating the DUT with lower operating voltage or higher operating frequencies than its nominal supply voltage and maximum operating frequency. For example, if the data sheet of the DUT specifies nominal supply at 1.2 V and maximum operating frequency at 1200 MHz. The stress conditions can be achieved by descending the voltage supply and ascending the operating frequency in multiple steps. For example, a voltage supply for the DUT in the stress condition could be 1.15 V, 1.10 V, 1.05 V, 1.00 V, or 0.95V, and an operating frequency of the DUT in the stress condition could be 1482 MHz, 1508 MHz, 1600 MHz, or 1700 MHz.

Furthermore, continue-on-fail test responses are shifted out of a plurality of scan output SO1-SOS of the DUT and all response mismatches are recorded. Unlike the traditional scan test, the scan test in the present invention will not be stopped even if failed test responses are found at certain scan output pins of the DUT.

In one embodiment, each of failed test response records information including: scan output pin, pattern number, cycle number, and expected value. As shown by FIG. 1, the test responses of the DUT are represented by a two-dimensional response grid. Each step on the horizontal axis corresponds to a single scan shift out cycle, and each step on the vertical axis corresponds to a single scan output pin. The horizontal steps are ordered in ascending order by pattern number and within each pattern by ascending cycle number. Given N patterns, C cycles per pattern, and S scan outputs, the total number of grid positions would equal to N×C×S.

At each grid position, the test response is either correct or a mismatch. A mismatch could be further distinguished by the expected digital value, either "0" or "1". Note that a masked test response in the grid equates to a correct response. A numeric value can be assigned to a test response at a grid position. According to various embodiments of the present invention, the test responses could be represented based on: binary assigning {0, 1}, or ternary assigning {0, 1, −1} as expressed below.

$$\text{Binary repsonse} = 0, \text{correct}$$
$$= 1, \text{mismatch}$$
$$\text{Ternary response} = 0, \text{correct}$$
$$= 1, \text{mismatch/expected to be 0}$$
$$= -1, \text{mismatch/expected to be 1}$$

Feature Extraction

Data collection procedure mentioned above produces a response grid for each DUT at each stress condition corner. Accordingly, comparative analysis of DUT response grids will be performed in order to further find similarities or dissimilarities between the response grids of SLT-fail and SLT-pass devices. If SLT-pass/fail devices make up the set of DUTs, it is possible to find certain grid positions whose values define a clear separation between SLT-pass and SLT-fail devices. Treating each grid position as an individual analysis feature appears daunting since the number of positions can be very large. There could be over 100 million per DUT per corner in a case of a SoC processor block. In view of this, the present invention attempts to group test responses into a smaller set of data features for analysis. Specific test responses corresponding to specific conditions will be grouped. Then, the mismatch count with respect to the grouped test responses is calculated (e.g. a feature value).

A failure feature comprising a group of test responses has a value defined to be the sum of a numeric response value (either binary or ternary) of individual positions. According to various embodiments, many different grouping schemes could be used. However, the simplest one of them is to group the entire response grid into a single failure feature, hereinafter referred to as "Total MisMatch Count" (TMMC). In this scheme, a total mismatch count corresponding to all test responses of each DUT will be calculated as a feature value. The principle of the TMMC feature is that a total mismatch count of an SLT-pass device is usually lower than the total mismatch count of an SLT-fail device. Using the TMMC as a failure feature, the device could be predicted as a SLT-pass device or a SLT-fail device without actually performing the SLT.

Figure 2:
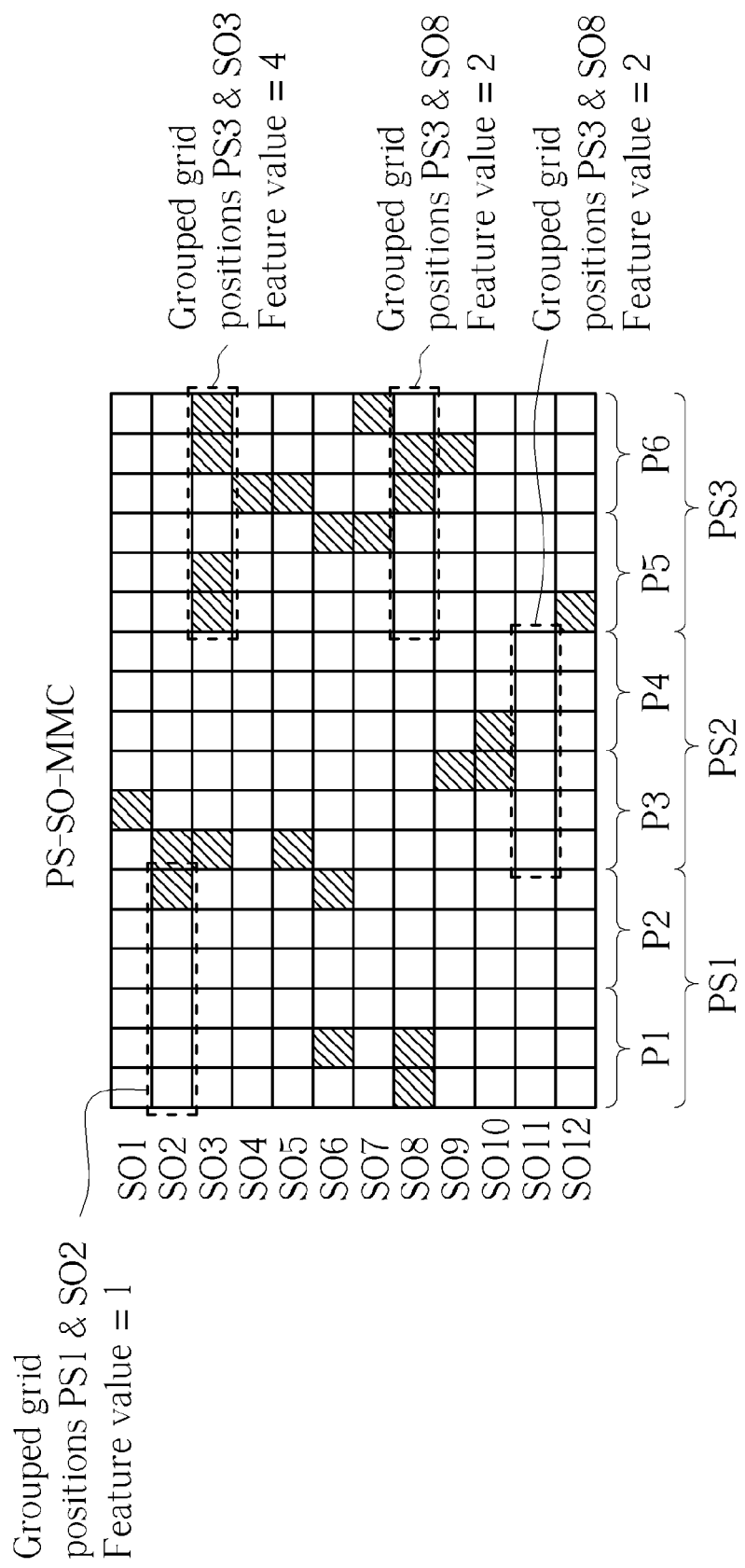
FIG. 2 illustrates an example of a grouping method "Pattern-Set Scan-Output MMC" according to one embodiment of the present invention.

FIG. 2 illustrates an example of another scheme which is referred to as we call "Pattern-Set Scan-Output MMC" (PS-SO-MMC) used in the present invention. This scheme relates to the way scan patterns are organized for the ATE. Due to memory restriction of the ATE, the complete set of scan patterns is split into multiple pattern sets, each containing a smaller number of patterns. During the scan test operation, pattern sets are loaded into ATE memory one at a time. In this scheme, response grid positions in each pattern set and scan output are grouped to form one PS-SO-MMC failure feature. Assuming R pattern sets, N patterns, C cycles per pattern, and S scan outputs, there would be R×S failure features. Each feature would contain (N/R)×C grid positions. The mismatch count corresponding to a specific scan output with respect to a specific pattern set will be calculated. In FIG. 2, the test responses form 36 PS-SO-MMC failure features of the DUT. As it is shown, grip positions at scan output SO2 with respect to pattern set PS1 are grouped to get a failure feature "PS1&SO2" having a feature value of 1 (which is determined by binary numeric responses of grouped grip positions, where there is only one mismatch response in the grouped grip positions), grip positions at scan output SO3 with respect to pattern set PS3 are grouped to get a failure feature "PS3&SO3" having a feature value of 4 (there is four mismatch responses in the grouped grip positions), grip positions at scan output SO8 with respect to pattern set PS3 are grouped to get a failure feature "PS3&SO8" having a feature value of 2 (there is two mismatch responses in the grouped grip positions), and grip positions at scan output SO11 with respect to pattern set PS2 are grouped to get a failure feature "PS2&SO11" having a feature value of 0 (there is no mismatch response in the grouped grip positions).

Figure 3:
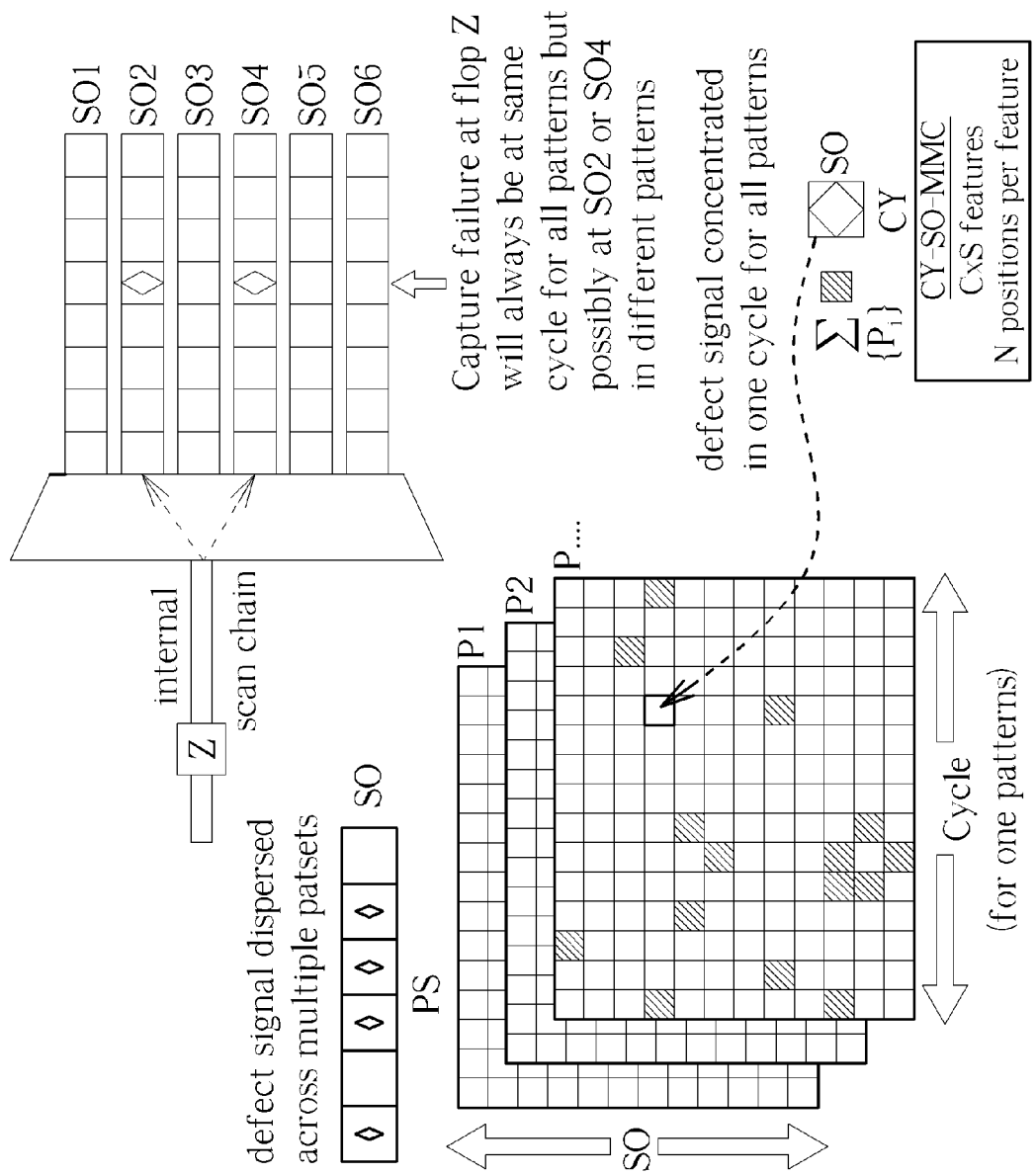
FIG. 3 illustrates an example of a grouping method "Cycle Scan-Output MMC" according to one embodiment of the present invention.

The response grid can be carved up in any number of ways to form specific data features. FIG. 3 illustrates still another scheme referred to as "Cycle Scan-Output MMC" (CY-SO-MMC) according to one embodiment of the present invention. Such scheme is motivated by the desire to increase signal strength of defects. Referring to FIG. 3, it shows a flop Z capturing failures when tested under stress due to a defect in an SLT-fail chip. Depending on conditions unique to each pattern, capture failure at Z may or may not occur with each pattern. In the example scenario as shown by the figure, scan compression with X-tolerance is deployed. This means the internal scan chain containing flop Z may fan out to multiple external scan outputs. However, due to internal chain position of flop Z, it will always be observed at the same cycle position in all patterns.

With PS-SO-MMC, capture failures at flop Z could be dispersed over too many features. As data collected by the present invention is inherently noisy, signal-to-noise ratio (SNR) of the defects under PS-SO-MMC may be too low for reliable detection. For CY-SO-MMC, each scan pattern is aligned on top of each other such that all response positions at the same cycle and scan output form a single feature. This will concentrate capture failures at flop Z into the same cycle and a few SO positions determined by X-tolerance routing.

Outlier Analysis Using Failure Feature

The extracted data feature set should possess two key attributes to enable outlier analysis. First, having many features (but not too many) would be conducive to multivariate data analytics. Second, each failure feature value (e.g. MMC corresponding to certain grouped test responses) should have sufficient numerical range to observe statistical properties.

Figure 4:
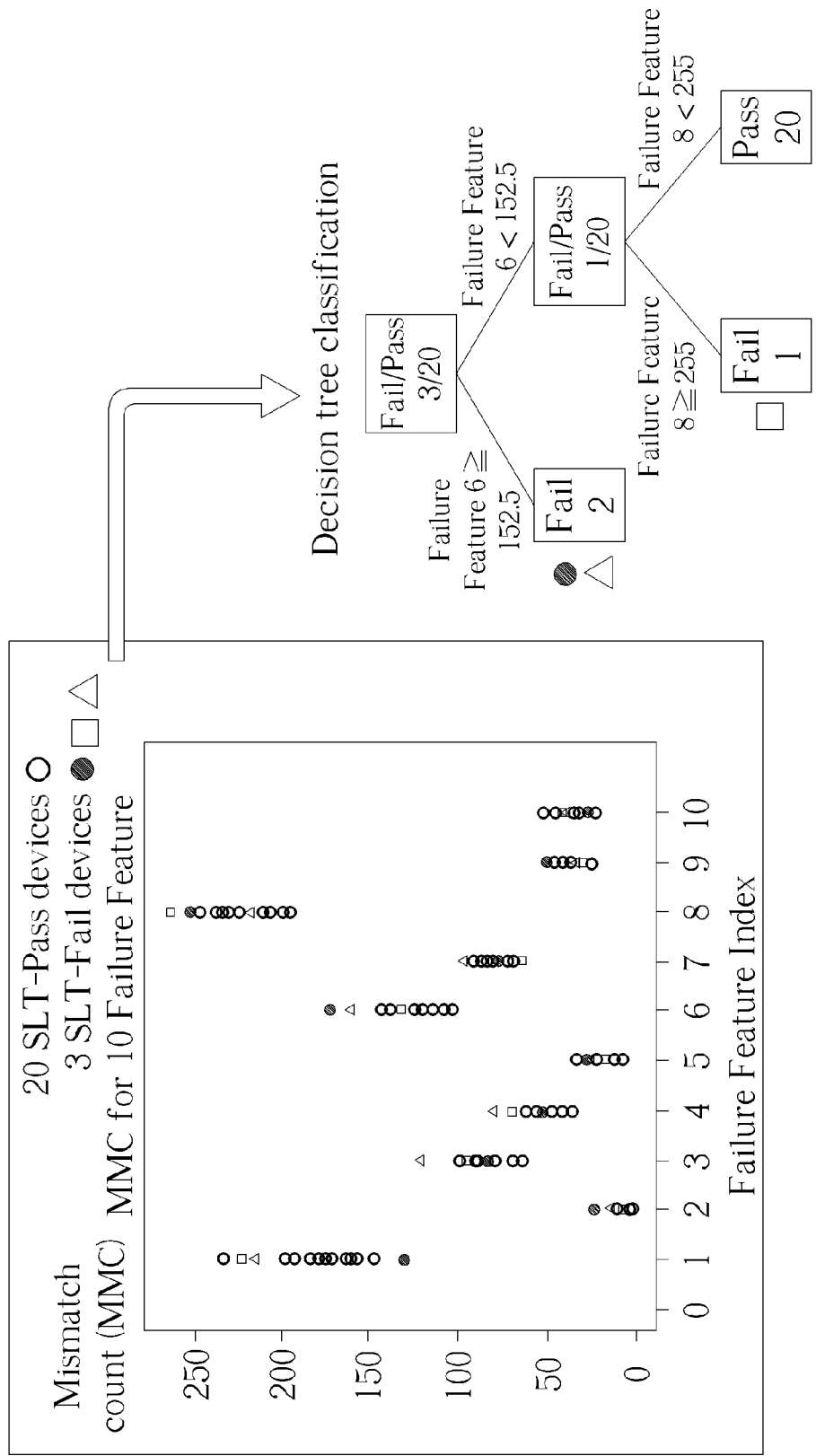
FIG. 4 illustrates applying decision tree classification to MMC failure features to obtain the separation conditions for SLT pass/fail device.

FIG. 4 illustrates how the application of decision tree classification to MMC failure features is used to determine a separating condition between SLT-pass and SLT-fail devices. In this embodiment, 10 MMC failure features are extracted from test responses of 23 devices by applying scan test under a certain stress condition, where 20 are SLT-passed and 3 are SLT-failed. As shown by FIG. 4, the 10 MMC failure features are positioned on the horizontal axis and the vertical axis marks MMC values. The MMC distribution of each feature is displayed by vertical scatter plots. A decision tree classifier is applied to determine the best failure features that can clearly separate SLT-passed from SLT-failed. In the example, two MMC failure features (e.g. failure feature 6 and failure feature 8) are sufficient to achieve separation for 20 SLT-pass devices and 3 SLT-fail devices. Accordingly, prediction rules are derived for implementation.

Based on the found best failure features for separating the SLT-pass devices from the SLT-fail devices, a separation condition (e.g. failure feature 6 less than MMC of 152.5 and failure feature 8 less than MMC of 255) could be found. The separation condition could be further analyzed to generate a featured scan pattern. The number of featured scan patterns required to identify bad DUTs from the DUTs will be much lower than the number of traditional OCC scan patterns because the featured scan patterns are based on analysis of test responses under stress conditions. That is, the featured scan pattern can be used to augment OCC scan patterns for optimizing the test flow, and the prediction of SLT/RMA failures can be accomplished by using featured scan patterns. Some devices can be determined to be SLT/RMA failures by performing scan test only according to featured scan patterns without actually entering the SLT stage.

FLOW OF THE INVENTION

Figure 5:
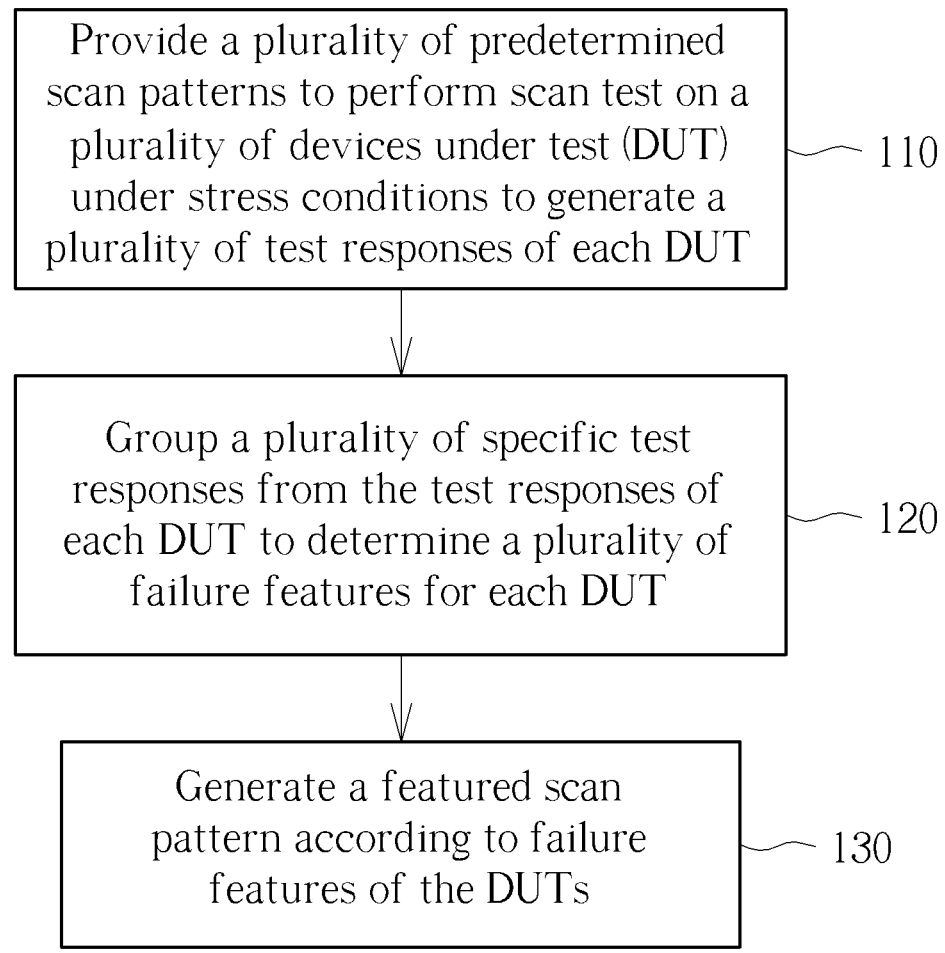
FIG. 5 illustrates a flow chart of a method according to one embodiment of the present invention.

The present invention can be summarized as a flow including steps as shown below and in FIG. 5:

Step 110: Provide a plurality of predetermined scan patterns to perform scan test on a plurality of devices under test (DUT) under stress conditions to generate a plurality of test responses of each DUT;

Step 120: Group a plurality of specific test responses of each DUT from the test responses of each DUT to determine a plurality of failure features for each DUT;

Step 130: Generate a featured scan pattern according to failure features of the DUTs.

In one embodiment, step 120 could be done by calculating a mismatch count (MMC) of grouped test responses of each DUT as the failure features of the DUT. In addition, each of DUTs would be determined as either system-level-test passed or system-level-test failed based on a SLT testing operation before the flow starts. Accordingly, step 130 would further determine a separation condition by performing outlier analysis on the MMC of the DUTs determined as system-level-test passed and the MMC of the DUT determined as system-level-test failed, and accordingly generates the featured scan pattern according to the separation condition. The flow and steps could be much clearer by referring to the following explanation about an apparatus of the present invention.

APPARATUS OF THE INVENTION

Figure 6:
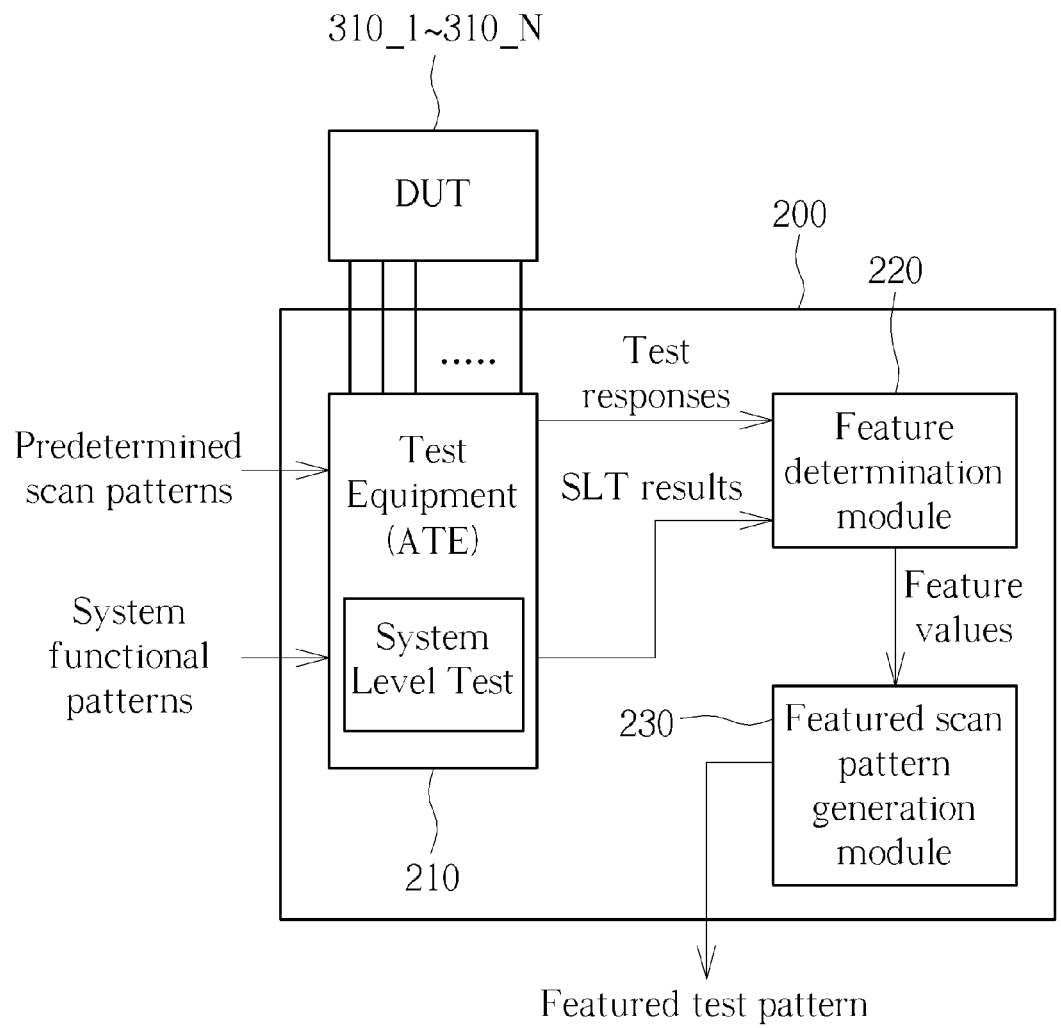
FIG. 6 illustrates a block diagram of an apparatus according to one embodiment of the present invention.

In one embodiment, steps 110-130 can be implemented by an apparatus as shown by FIG. 6. As shown, an apparatus 200 includes test equipment 210, a feature determination module 220 and a featured scan pattern generation module 230. The test equipment 210 is configured to perform scan test, according to a plurality of predetermined scan patterns, on DUT 310_1-310_N under stress conditions (lower voltage supply and higher operating frequency) to generate a plurality of test responses (e.g. the response grid as illustrated by FIG. 1) of each DUT. In one embodiment, the plurality of predetermined scan patterns could be transition delay fault scan pattern. However, this is not a limitation of the present invention. According to various embodiments, other types of the scan pattern could be used. In addition, the test equipment 210 further performs a system level test on each DUT based on system functional patterns, which is intended for generating SLT result to indicate a DUT as system-level-test failed or system-level-test passed. SLT results and test responses of each DUT 310_1-310_N will be sent to the feature determination module 220. The feature determination module 220 groups a plurality of specific test responses of each DUT 310_1-310_N from the test responses of each DUT 310_1 -310_N to determine feature values corresponding to a plurality of failure features for each DUT 310_1-310_N. The ways of grouping could be one or multiple of TMMC, PS-SO-MMC, and CY-SO-MMC, or other ways of grouping. Depending on the grouping operation performed by the feature determination module 220, there could be one or multiple feature values corresponding to different failure features for each DUT 310_1-310_N. For example, as illustrated by FIG. 4, there are 10 failure features generated for each DUT 310_1-310_N. Each DUT 310_1-310_N has 10 feature values respectively corresponding to 10 failure features. The generated feature values of each DUT 310_1-310_N would be sent to the featured scan pattern generation module 230, which generates at least one featured scan pattern according to feature values of the DUT 310_1-310_N. In particular, the featured scan pattern generation module 230 would determine a separation condition by performing an outlier analysis on mismatch counts (based on the MMC distribution with respect to each failure feature) of the DUTs that are determined as system-level-test passed and total mismatch counts of the DUT that are determined as system-level-test failed (according to SLT results generated by the test equipment 210). Accordingly, the featured scan pattern generation module 230 generates the featured scan pattern according to the separation condition. For example, the featured scan pattern generation module 230 may use the decision tree classification skill illustrated by FIG. 4 to determine the failure feature 6 at MMC of 152.5 and failure feature 8 at MMC of 255 as a separation condition, and accordingly generates at least one featured scan pattern according to the a separation condition.

An embodiment of the invention may include functionality that may be implemented as software executed by a processor, hardware circuits or structures, or a combination of both. The processor may be a general-purpose or dedicated processor. The software may comprise programming logic, instructions or data to implement certain functionality for an embodiment of the invention. The software may be stored in a medium accessible by a machine or computer-readable medium, such as read-only memory (ROM), random-access memory (RAM), magnetic disk (e.g., floppy disk and hard drive), optical disk (e.g., CD-ROM) or any other data storage medium. In one embodiment of the invention, the media may store programming instructions in a compressed and/or encrypted format, as well as instructions that may have to be compiled or installed by an installer before being executed by the processor. Alternatively, an embodiment of the invention may be implemented as specific hardware components that contain hard-wired logic for performing the recited functionality, or by any combination of programmed general-purpose computer components and custom hardware components.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

In conclusion, the present invention collects test data under stress conditions in response to a large amount of scan patterns and groups a portion of the test data to derive feature values corresponding to specific failure features. Accordingly, the present invention performs outlier analysis on the feature values corresponding to the failure features to find a way of predicting SLT/RMA failures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of generating a featured scan pattern for scan test, comprising:
   providing a plurality of predetermined scan patterns to perform scan test on a plurality of devices under test (DUT) under stress conditions to generate a plurality of test responses of each DUT;
   grouping a plurality of specific test responses of each DUT from the test responses of each DUT to determine feature values corresponding to a plurality failure features for each DUT; and
   generating at least one featured scan pattern according to the feature values of each DUT.

2. The method of claim 1, wherein the step of determining the feature values corresponding to the failure features for each DUT comprises:
   calculating a mismatch count corresponding to the specific test responses of each DUT as the feature value of the DUT.

3. The method of claim 2, further comprising:
determining each of the DUTs as either system-level-test passed or system-level-test failed; and
wherein the step of generating the featured scan pattern according to the feature values of each DUT comprises:
determining a separation condition by performing an outlier analysis on mismatch counts of the DUTs determined as system-level-test passed and mismatch counts of the DUTs determined as system-level-test failed; and
generating at least one featured scan pattern according to the separation condition.

4. The method of claim 1, wherein the step of performing the scan test on the DUTs under the stress condition comprises:
operating each DUT with a specific operating voltage that is lower than a nominal supply voltage of the DUT.

5. The method of claim 1, wherein the step of performing the scan test on the DUTs under the stress condition comprises:
operating each DUT with a specific operating frequency that is higher than a nominal operating frequency of the DUT.

6. The method of claim 1, wherein the step of performing the scan test on the DUTs under the stress condition to generate the test responses of the DUTs comprises:
continually performing the scan test on one of DUTs even if a failed test response is detected at a specific scan output pin of one of the DUTs.

7. The method of claim 1, wherein the specific test responses of each DUT correspond to at least one specific scan output pin of the DUT.

8. The method of claim 1, wherein the specific test responses of each DUT correspond to at least one specific scan output cycle.

9. The method of claim 1, wherein the specific test responses of each DUT correspond to at least one specific predetermined scan pattern.

10. The method of claim 1, wherein the plurality of predetermined pattern uses an on-chip clock of the DUTs.

11. The method of claim 1, wherein the DUT is a core of a multi-core processor.

12. An apparatus of generating a featured scan pattern for scan test, comprising:
a test equipment, configured to perform scan test, according to a plurality of predetermined scan patterns, on a plurality of devices under test (DUT) under stress conditions to generate a plurality of test responses of each DUT;
a feature determination module, coupled to the test equipment, and configured to group a plurality of specific test responses of each DUT from the test responses of each DUT to determine feature values corresponding to a plurality failure features for each DUT; and
a featured scan pattern generation module, coupled to the feature determination module and configured to generate at least one featured scan pattern according to the feature values of each DUT.

13. The apparatus of claim 12, wherein the feature determination module is configured to calculate a mismatch count corresponding to the specific test responses of each DUT as the feature value of the DUT.

14. The apparatus of claim 13, wherein the test equipment determines each of the DUTs as either system-level-test passed or system-level-test failed, the feature determination module is configured to determine a separation condition by performing an outlier analysis of feature mismatch counts of the DUTs determined as system-level-test passed and feature mismatch counts of the DUTs determined as system-level-test failed; and the featured scan pattern generation module is configured to generate the at least one featured scan pattern according to the separation condition.

15. The apparatus of claim 12, wherein the test equipment is configured to perform the scan test while operating each DUT with a specific operating voltage that is lower than a nominal supply voltage of the DUT.

16. The apparatus of claim 12, wherein the test equipment is configured to perform the scan test while operating each DUT with a specific operating frequency that is higher than a nominal operating frequency of the DUT.

17. The apparatus of claim 12, wherein the test equipment is configured to continually perform the scan test on one of the DUTs even if a failed test response is detected at a specific scan output pin of one of the DUTs.

18. The apparatus of claim 12, wherein the specific test responses of each DUT correspond to at least one specific scan output pin of the DUT.

19. The apparatus of claim 12, wherein the specific test responses of each DUT correspond to at least one specific scan output cycle.

20. The apparatus of claim 12, wherein the specific test responses of each DUT correspond to at least one specific predetermined scan pattern.

21. The apparatus of claim 12, wherein the plurality of predetermined pattern uses an on-chip clock of the DUTs.

22. The apparatus of claim 12, wherein the DUT is a core of a multi-core processor.

* * * * *